United States Patent
Huang et al.

(10) Patent No.: US 10,302,726 B2
(45) Date of Patent: May 28, 2019

(54) IMAGE RECONSTRUCTION FOR MRI USING MULTIPLEXED SENSITIVITY ENCODING

(71) Applicants: KONINKLIJKE PHILIPS N.V., Eindhoven (NL); TSINGHUA UNIVERSITY, Beijing (CN)

(72) Inventors: Feng Huang, Eindhoven (NL); Hua Guo, Eindhoven (NL); Zhe Zhang, Eindhoven (NL); Bi Da Bd Zhang, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 146 days.

(21) Appl. No.: 15/322,502

(22) PCT Filed: Jul. 1, 2015

(86) PCT No.: PCT/IB2015/054952
§ 371 (c)(1),
(2) Date: Dec. 28, 2016

(87) PCT Pub. No.: WO2016/001853
PCT Pub. Date: Jan. 7, 2016

(65) Prior Publication Data
US 2018/0217218 A1     Aug. 2, 2018

(30) Foreign Application Priority Data
Jul. 3, 2014   (WO) ............... PCT/CN2014/081577

(51) Int. Cl.
*G01V 3/00* (2006.01)
*G01R 33/561* (2006.01)
(Continued)

(52) U.S. Cl.
CPC ...... *G01R 33/5611* (2013.01); *G01R 33/5615* (2013.01); *G01R 33/5616* (2013.01); *G01R 33/56341* (2013.01); *G01R 33/56509* (2013.01)

(58) Field of Classification Search
CPC ............. G01R 33/543; G01R 33/5659; G01R 33/3415; G01R 33/36; A61B 5/055
(Continued)

(56) References Cited

U.S. PATENT DOCUMENTS

| 7,408,345 B2 | 8/2008 | Bammer | |
| 2009/0163797 A1* | 6/2009 | Jurrissen | G01R 33/5611 600/410 |

(Continued)

FOREIGN PATENT DOCUMENTS

WO   2009135167 A1   11/2009

OTHER PUBLICATIONS

Then Nan-Kuei et al: "A robust multi-shot scan strategy for high-resolution diffusion weighted MRI enabled by multiplexed sensitivity-encoding (MUSE)", Neuroimage, Academic Press, Orlando, FL, US, vol. 72, Jan. 28, 2013 (Jan. 28, 2013), pp. 41-47.
(Continued)

*Primary Examiner* — Walter L Lindsay, Jr.

(57) ABSTRACT

This invention provides an image processing method and apparatus for reconstructing an image of a site of a subject. The image processing method comprises: generating a first estimated phase of each shot of multiple shots of the site by sensitivity encoding based on shot data of the corresponding shot obtained for the site; reconstructing a first multiplexed sensitivity encoded image based on the first estimated phase of each shot and shot data of each shot; generating a second estimated phase of each shot of the multiple shots by regularized sensitivity encoding using the first multiplexed
(Continued)

sensitivity encoded image; and reconstructing a second multiplexed sensitivity encoded image based on the second estimated phase of each shot and shot data of each shot. In this way, the quality of the finally reconstructed image in magnetic resonance imaging is further improved.

20 Claims, 4 Drawing Sheets (51) Int. Cl.
G01R 33/563 (2006.01)
G01R 33/565 (2006.01)

(58) Field of Classification Search
USPC ......................................................... 324/309
See application file for complete search history.

(56) References Cited

U.S. PATENT DOCUMENTS

2012/0049845 A1* 3/2012 Bito ..................... G01R 33/485
324/309
2013/0182932 A1* 7/2013 Chen ................ G01R 33/56509
382/131
2014/0002078 A1* 1/2014 Chen ..................... G01R 33/543
324/309
2015/0212180 A1 7/2015 Fuderer et al.

OTHER PUBLICATIONS

Nan-Kuei Chen et al "Removal of EIP Nyquist ghost artifacts with two-dimensional phase correction", Magnetic Resonance in Medicine, vol. 51, No. 6, Jan. 1, 2004 (Jan. 1, 2004), pp. 1247-1253.

Zhang Z et al: "Self-feeding MUSE: A method for high resolution diffusion weighted imaging with robust phase variation estimation",Proceedings of the International Society for Magnetic Resonance in Medicine, 23nd Annual Meeting and Exhibition, Toronto,Canada, May 30-Jun. 5, 2015,vol.23 Apr. 28, 2014 (Apr. 28, 2014), p. 4445.

Pruessmann KP, Weiger M, Scheidegger MB, Boesiger P. SENSE: Sensitivity encoding for fast MRI. Magn Reson Med 1999;42:952-962.

Lin F-H, Kwong KK, Belliveau JW, Wald LL. Parallel Imaging Reconstruction Using Automatic Regularization. Magn Reson Med 2004;51:559-567.

* cited by examiner

IMAGE RECONSTRUCTION FOR MRI USING MULTIPLEXED SENSITIVITY ENCODING

CROSS REFERENCE TO RELATED APPLICATIONS

This application is a U.S. national phase application of International Application No. PCT/IB2015/054952, filed on Jul. 1, 2015, which claims the benefit of PCT/CN2014/081577 filed on Jul. 3, 2014 and is incorporated herein by reference.

FIELD OF THE INVENTION

The invention relates to magnetic resonance imaging, in particular to an image processing method and apparatus for reconstructing an image of a site of a subject.

BACKGROUND OF THE INVENTION

In magnetic resonance imaging (MRI), pulse sequences consisting of RF and magnetic field gradient pulses are applied to a site of a subject (a patient) to generate phase encoded magnetic resonance signals, which are scanned by means of receiving antennas in order to obtain information from the site of the subject and to reconstruct images thereof.

As a form of MRI, emergence of diffusion weighted imaging (DWI) provides means for investigating flowing direction and speed of body molecules to determine the health status of human beings, etc. by detecting body molecule diffusion. Echo planar imaging (EPI) becomes one of the most important forms of DWI because it can be used for quick imaging in clinical practice. DWI data have been commonly acquired using single-shot EPI. A shot means a subsample of a magnetic resonance signal obtained by applying pulse sequences consisting of RF and magnetic field gradient pulses to the site (body molecules in DWI or EPI) of the subject. Single-shot EPI means EPI which only subsamples once the magnetic resonance signal obtained by applying pulse sequences to the site (body molecules in DWI or EPI) of the subject e.g. by using receiving antennas or coils to obtain DWI data for the only one subsample, for further use in reconstructing the image.

However, single-shot EPI is often limited in spatial resolution, making it difficult to measure detailed diffusion properties in fine structures where a high spatial resolution is required. Thus, multi-shot EPI acquisition and reconstruction schemes have been proposed. Multi-shot EPI means EPI which takes multiple subsamples of the magnetic resonance signal obtained by applying pulse sequences to the site of the subject e.g. by using multiple receiving antennas or coils to obtain DWI data for the multiple subsamples, for further use in reconstructing the image.

In multi-shot EPI, tiny inter-shot motion can result in significant phase differences. In order to reduce the influence of the phase differences, a partially parallel imaging method such as a sensitivity-encoding (SENSE) method is proposed to reconstruct an image for each shot of the multiple shots of the multi-shot EPI. Then, for example, multiple images reconstructed for the multiple shots are averaged to obtain a final reconstructed image. However, the SENSE method still dramatically reduces SNR of the final reconstructed image and is limited by the number of shots, which is equivalent to the acceleration factor in SENSE.

In order to overcome the deficiency of the SENSE method, a multiplexed sensitivity-encoding (MUSE) method is proposed. Although the MUSE method can increase SNR of the final reconstructed image as compared to the SENSE method, because the number of SENSE operations is equal to the number of shots, when the number of shots is high, the SENSE operation in the MUSE method has difficulty to provide a reasonable image quality.

SUMMARY OF THE INVENTION

Based on the prior art described above, it is beneficial to further improve the quality of the finally reconstructed image in the MUSE method.

According to an embodiment of an aspect of this invention, an image processing method for reconstructing an image of a site of a subject is provided. The image processing method comprises: generating a first estimated phase of each shot of multiple shots by sensitivity encoding based on shot data of the corresponding shot obtained for the site; reconstructing a first multiplexed sensitivity encoded image based on the first estimated phase of each shot and shot data of each shot; generating a second estimated phase of each shot of the multiple shots by regularized sensitivity encoding using the first multiplexed sensitivity encoded image; and reconstructing a second multiplexed sensitivity encoded image based on the second estimated phase of each shot and shot data of each shot.

This embodiment of the invention adopts at least two consecutive MUSE reconstructions to reconstruct an image from multiple shots, wherein the result of the first MUSE reconstruction is fed back to regularize the SENSE operation in the second MUSE reconstruction. Thus, the estimated phase generated in the regularized SENSE operation in the second MUSE reconstruction is more accurate, thereby further improving the quality of the finally reconstructed image in the MUSE method.

According to an embodiment of this invention, the step of generating a second estimated phase of each shot of the multiple shots comprises generating the second estimated phase of each shot of the multiple shots by regularized sensitivity encoding based on shot data of the corresponding shot, and at least a magnitude of the first multiplexed sensitivity encoded image.

According to an embodiment of this invention, the regularized sensitivity encoding based on shot data of the corresponding shot and at least a magnitude of the first multiplexed sensitivity encoded image is performed by solving a regularization equation to be minimum, the regularization equation being equal to a data fidelity term plus a regularization term, the data fidelity term representing consistence between the reconstructed second multiplexed sensitivity encoded image and shot data of each shot obtained for the site, and the regularization term representing consistence between a magnitude of the reconstructed second multiplexed sensitivity encoded image and the magnitude of the first multiplexed sensitivity encoded image.

The more consistent the reconstructed image is with shot data of each shot, the higher is the quality of the finally reconstructed image, while the more consistent the magnitude of the reconstructed image is with the magnitude of the first multiplexed sensitivity encoded image, the higher is the quality of the finally reconstructed image. However, the consistence between the reconstructed image and shot data of each shot is sometimes contrary to the consistence between the magnitude of the reconstructed image and the magnitude of the first multiplexed sensitivity encoded image. Thus, solving the equation, comprising the consistence between the reconstructed image and shot data of each shot and the consistence between the magnitude of the reconstructed image and the magnitude of the first multiplexed sensitivity encoded image, to be minimum can balance both aspects well to achieve a high quality of the finally reconstructed image.

According to an embodiment of this invention, the shot data of the corresponding shot obtained for the site is obtained by subsampling a phase encoded magnetic resonance signal, the phase encoded magnetic resonance signal being generated by applying RF pulses and magnetic field gradient pulses or diffusion gradients to the site.

According to an embodiment of this invention, the shot data of the corresponding shot obtained for the site is obtained by subsampling a phase encoded magnetic resonance signal, the phase encoded magnetic resonance signal being generated by consecutively applying, upon RF pulse excitation, forward and reverse switched magnetic field gradient pulses to the site.

According to an embodiment of another aspect of this invention, an image processing apparatus for constructing an image of a site of a subject is provided. The image processing apparatus comprises: a first generating unit configured to generate a first estimated phase of each shot of multiple shots by sensitivity encoding based on shot data of the corresponding shot obtained for the site; a first reconstructing unit configured to reconstruct a first multiplexed sensitivity encoded image based on the first estimated phase of each shot and shot data of each shot; a second generating unit configured to generate a second estimated phase of each shot of the multiple shots by regularized sensitivity encoding using the first multiplexed sensitivity encoded image; a second reconstructing unit configured to reconstruct a second multiplexed sensitivity encoded image based on the second estimated phase of each shot and shot data of each shot.

According to an embodiment of this invention, the second generating unit is further configured to generate the second estimated phase of each shot of the multiple shots by regularized sensitivity encoding based on shot data of the corresponding shot, and at least a magnitude of the first multiplexed sensitivity encoded image.

According to an embodiment of this invention, the regularized sensitivity encoding based on shot data of the corresponding shot and at least a magnitude of the first multiplexed sensitivity encoded image is performed by solving a regularization equation to be minimum, the regularization equation being equal to a data fidelity term plus a regularization term, the data fidelity term representing consistence between the reconstructed second multiplexed sensitivity encoded image and shot data of each shot obtained for the site, and the regularization term representing consistence between a magnitude of the reconstructed second multiplexed sensitivity encoded image and the magnitude of the first multiplexed sensitivity encoded image.

According to an embodiment of this invention, the regularization term is proportional to a norm of an absolute value of the desired image whose phase is to be estimated by the second generating unit minus the magnitude of the first multiplexed sensitivity encoded image.

According to an embodiment of this invention, the regularization term is proportional to a norm of the desired image whose phase is to be estimated by the second generating unit minus a product of the magnitude of the first multiplexed sensitivity encoded image and the first estimated phase of each shot.

According to an embodiment of this invention, the regularization term is proportional to a norm of a gradient of an absolute value of the desired image whose phase is to be estimated by the second generating unit minus a product of the magnitude of the first multiplexed sensitivity encoded image and the first estimated phase of each shot.

According to an embodiment of this invention, the first estimated phase of each shot is smoothed before multiplying the magnitude of the first multiplexed sensitivity encoded image to obtain the product.

Because the first estimated phase of each shot is smoothed before multiplying the magnitude of the first multiplexed sensitivity encoded image to obtain the product in this embodiment, the smoothing further improves the quality of the finally reconstructed image in the MUSE method.

According to an embodiment of this invention, the data fidelity term is proportional to a norm of a constant matrix multiplying the desired image whose phase is to be estimated by the second generating unit minus shot data of each shot.

According to an embodiment of this invention, the shot data of the corresponding shot obtained for the site is obtained by subsampling a phase encoded magnetic resonance signal, the phase encoded magnetic resonance signal being generated by consecutively applying, upon RF pulse excitation, by forward and reverse switched magnetic field gradient pulses to the site.

According to an embodiment of yet another aspect of this invention, a magnetic resonance imaging device is provided. The magnetic resonance imaging device comprises: a radiation emitter configured to apply RF pulses to a site of a subject; a gradient coil configured to apply magnetic field gradient pulses to the site so that the applied RF pulses and the applied magnetic field gradient pulses together generate a phase encoded magnetic resonance signal at the site; a plurality of obtaining units configured to respectively subsample the phase encoded magnetic resonance signal at the site to obtain shot data of multiple shots; an image processing apparatus configured to generate a first estimated phase of each shot of the multiple shots by sensitivity encoding based on shot data of the corresponding shot; reconstruct a first multiplexed sensitivity encoded image based on the first estimated phase of each shot and shot data of each shot; generate a second estimated phase of each shot of the multiple shots by regularized sensitivity encoding using the first multiplexed sensitivity encoded image; reconstruct a second multiplexed sensitivity encoded image based on the second estimated phase of each shot and shot data of each shot.

These and other aspects of the invention will be apparent from and elucidated with reference to the embodiments described hereinafter.

DESCRIPTION OF THE DRAWINGS

The above and other objects and features of the present invention will become more apparent from the following detailed description considered in connection with the accompanying drawings, in which.

The same reference numerals are used to denote similar parts throughout the figures.

DETAILED DESCRIPTION

A detailed description of the present invention is given below in connection with the accompanying drawings.

Figure 1:
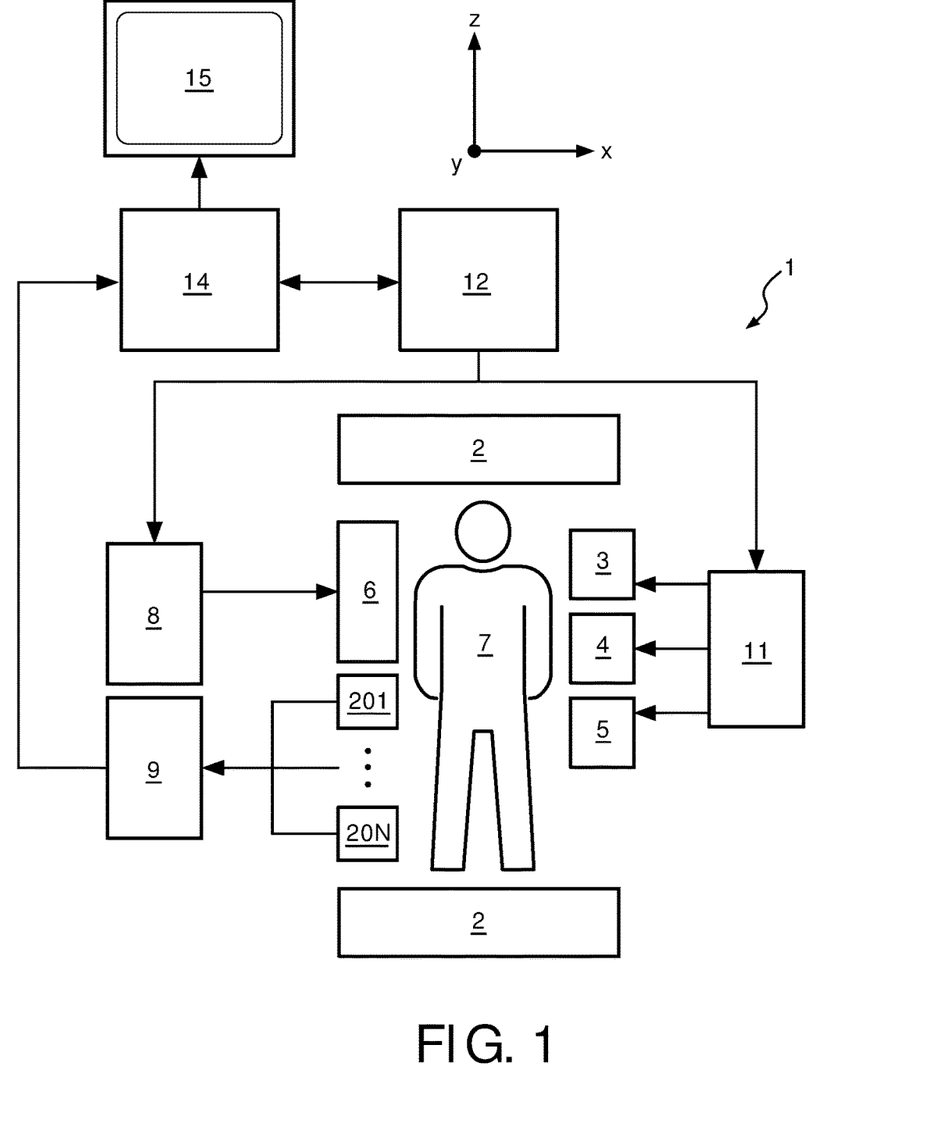
FIG. 1 depicts a magnetic resonance imaging device according to an embodiment of this invention.

In FIG. 1, a magnetic resonance imaging device 1 in accordance with an embodiment of the present invention is shown as a block diagram. The magnetic resonance imaging device 1 comprises a set of main magnetic coils 2 for generating a stationary and homogeneous main magnetic field and three sets of gradient coils 3, 4 and 5 for superimposing additional magnetic fields of controllable strength and having a gradient in a selected direction. Conventionally, the direction of the main magnetic field is labelled the z-direction, the two directions perpendicular thereto are the x- and y-directions. The gradient coils are energized via a power supply 11. The magnetic resonance imaging device 1 further comprises a radiation emitter 6, which is an antenna or coil, for emitting radio frequency (RF) pulses to a subject 7, the radiation emitter 6 being coupled to a modulator 8 for generating and modulating the RF pulses. After the radiation emitter 6 applies RF pulses and the gradient coils 3, 4 and 5 apply magnetic field gradient pulses to the subject 7, a phase encoded magnetic resonance signal is generated in and around the subject 7, which could be scanned or subsampled by obtaining units 201 . . . 20N. To obtain an image of a site in the subject 7, the obtaining units 201 . . . 20N are placed near the site for respectively subsampling the phase encoded magnetic resonance signal near the site. A subsample of the phase encoded magnetic resonance signal is herein called a shot. A subsampled magnetic resonance signal obtained by subsampling the phase encoded magnetic resonance signal by one of obtaining units 201 . . . 20N is called shot data of a shot. Therefore, obtaining units 201 . . . 20N obtain shot data of multiple shots.

The obtaining units 201 . . . 20N can be realized in different ways. For example, they may be receiving antennas. As another example, they may be separate surface coils with different spatial sensitivity profiles.

Figure 5:
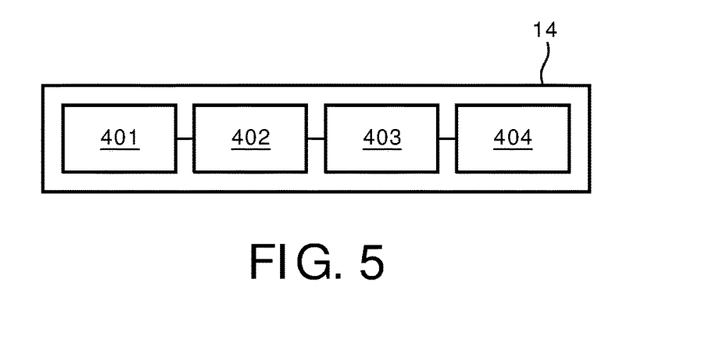
FIG. 5 depicts a block chart of a device according to an embodiment of this invention according to an embodiment of this invention.

The shot data of multiple shots obtained by the obtaining units 201 . . . 20N is input to a demodulator 9. The modulator 8, the emitter 6 and the power supply 11 for the gradient coils 3, 4 and 5 are controlled by a control system 12 to generate the actual imaging sequence for SENSE imaging in accordance with the above-described invention. The control system is usually a microcomputer with a memory and a program control. The demodulator 9 is coupled to a data processing unit 14, for example a computer, for reconstructing the image of the site. As shown in FIG. 5, the data processing unit 14 may comprise a first generating unit 402, a first reconstructing unit 403, a second generating unit 404 and a second reconstructing unit 405, which are discussed in detail in the following. The image reconstructed or obtained by the data processing unit 14 can be made visible, for example, on a display 15.

In an embodiment, the gradient coils 3, 4 and 5 may apply magnetic field gradient pulses or diffusion gradients to the site of the subject 7. That is, the phase encoded magnetic resonance signals subsampled by obtaining units 201 . . . 20N are generated by applying RF pulses and magnetic field gradient pulses or diffusion gradients to the site. In this way, the diffusion status of body liquid molecules can be detected well and thus the quality of the finally reconstructed image can be further improved especially for detection of the site relating to body liquid.

In an alternative embodiment, when the radiation emitter 6 emits RF pulses to the site, the gradient coils 3, 4 and 5 apply consecutively forward and reverse switched magnetic field gradient pulses to the site of the subject 7. That is, the phase encoded magnetic resonance signals subsampled by obtaining units 201 . . . 20N are generated by consecutively applying, upon RF pulse excitation, forward and reverse switched magnetic field gradient pulses to the site. By consecutively applying forward and reverse switched magnetic field gradient pulses, the finally reconstructed image of acceptable quality can be obtained rapidly, which is especially helpful in medical detection that needs fast imaging.

Figure 2:
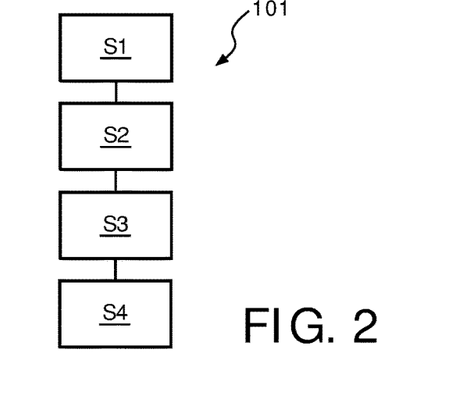
FIG. 2 depicts a flowchart of a method according to an embodiment of this invention.

FIG. 2 depicts a flowchart of an image processing method 101 for reconstructing an image of a site of a subject according to an embodiment of this invention.

Herein, a subject means an object to be tested or observed by a magnetic resonance imaging method, such as a patient or a healthy person undergoing a health examination, or an animal whose healthy status is to be examined. A site means a part of the body of the subject, e.g. an organ, blood in a blood vessel in the arm, etc. The image processing method 101 for reconstructing an image of a site of a subject could be used for e.g. imaging blood in a blood vessel or imaging body molecules in an organ.

Referring to FIG. 2, the method 101 comprises a step S1 of generating a first estimated phase of each shot of multiple shots by sensitivity encoding (SENSE) based on shot data of the corresponding shot obtained for the site.

As discussed above, a shot means a subsample of a magnetic resonance signal obtained by applying pulse sequences to the site of the subject in the magnetic resonance imaging, and shot data of a shot means a subsampled magnetic resonance signal obtained by subsampling the magnetic resonance signal. The shot data of each shot is obtained by the obtaining units 201 . . . 20N in FIG. 1 or by an obtaining unit which has a different subsampling channel for subsampling the magnetic resonance signal, respectively.

Figure 3:
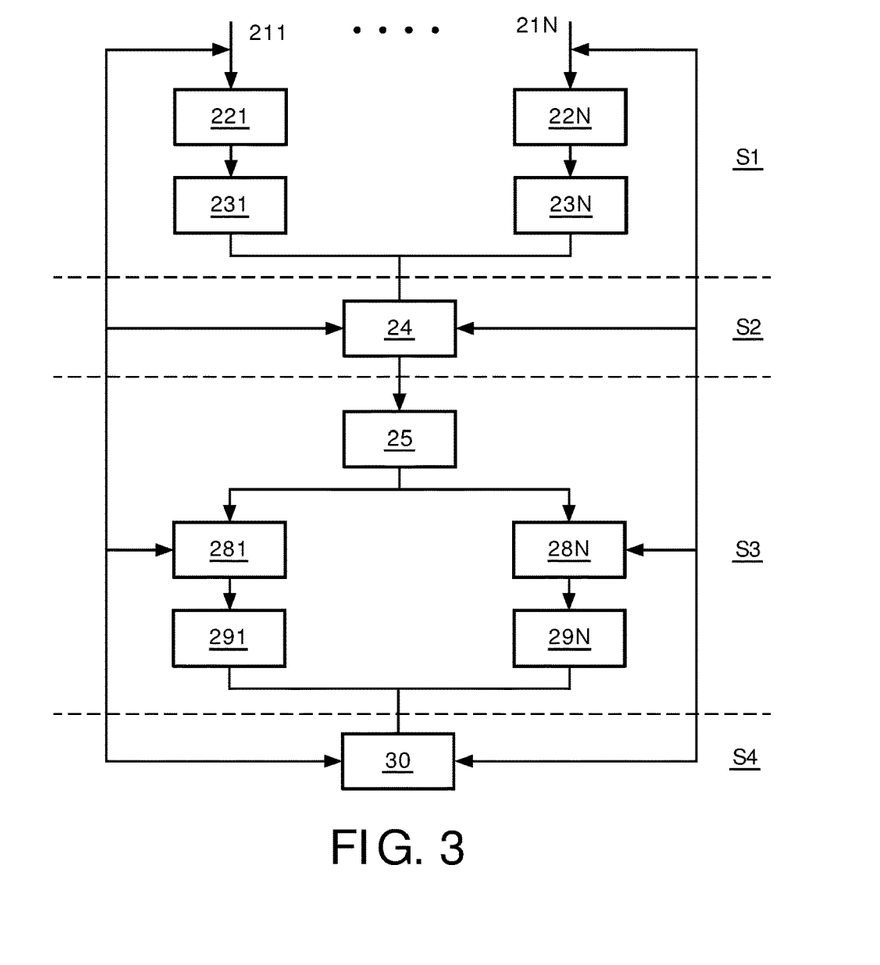
FIG. 3 depicts a schematic graph of the detailed implementation of the method according to an embodiment of this invention.

For example, there are N shots. Shot data 211 . . . 21N in FIG. 3 are obtained respectively by the obtaining units 201 . . . 20N.

As illustrated above, SENSE is a known method in reconstructing an image in multi-shot EPI. Based on shot data of a shot, SENSE can estimate a phase of the shot. Taking the example of FIG. 3, SENSE operations 221, . . . , 22N respectively generate the first estimated phases 231, . . . , 23N based on shot data 211, . . . , 21N.

The method further comprises step S2 of reconstructing a first multiplexed sensitivity encoded (MUSE) image based on the first estimated phase of each shot and shot data of each shot.

A MUSE method is used to reconstruct an image based on shot data of each shot and phase estimation results of the SENSE operations it includes.

Again taking the example of FIG. 3, a first MUSE image 24 is reconstructed based on the first estimated phases 231, . . . , 23N and the shot data 211, . . . , 21N.

The method further comprises step S3 of generating a second estimated phase of each shot of the multiple shots by regularized sensitivity encoding using the first multiplexed sensitivity encoded image.

In an embodiment, the regularized sensitivity encoding is based on shot data of the corresponding shot, and at least a magnitude of the first multiplexed sensitivity encoded image.

As discussed above, the more consistent the reconstructed image is with shot data of each shot, the higher is the quality of the finally reconstructed image, while the more consistent the magnitude of the reconstructed image is with the magnitude of the first multiplexed sensitivity encoded image, the higher is the quality of the finally reconstructed image. So, the regularized sensitivity encoding based on shot data of the corresponding shot and at least a magnitude of the first multiplexed sensitivity encoded image ensures that the reconstructed image cannot depart much from both the shot data of each shot and the magnitude of the first multiplexed sensitivity encoded image.

In an embodiment, the regularized sensitivity encoding based on shot data of the corresponding shot and at least a magnitude of the first multiplexed sensitivity encoded image is performed by solving a regularization equation to be minimum, the regularization equation being equal to a data fidelity term plus a regularization term, the data fidelity term representing consistence between the reconstructed second multiplexed sensitivity encoded image and shot data of each shot obtained for the site, and the regularization term representing consistence between a magnitude of the reconstructed second multiplexed sensitivity encoded image and the magnitude of the first multiplexed sensitivity encoded image.

Besides solving this regularization equation, there are other ways to conduct the regularized sensitivity encoding based on shot data of the corresponding shot and at least a magnitude of the first multiplexed sensitivity encoded image. For example, many possible reconstructed second multiplexed sensitivity encoded images are conceived first. Then, for each of these possible reconstructed second multiplexed sensitivity encoded images, a database is established. In such a database, for this reconstructed second multiplexed sensitivity encoded image, many possible shot data of a shot is pre-conceived and stored together with pre-computed consistence between this reconstructed second multiplexed sensitivity encoded image and each of these possible shot data. In such a database, for this reconstructed second multiplexed sensitivity encoded image, many possible magnitudes of the first multiplexed sensitivity encoded image are pre-conceived and stored together with pre-computed consistence between the magnitude of the reconstructed second multiplexed sensitivity encoded image and each of these possible magnitudes of the first multiplexed sensitivity encoded image. Then, when actual shot data of a shot and an actual first multiplexed sensitivity encoded image are obtained, each of the established databases corresponding to each of these conceived reconstructed second multiplexed sensitivity encoded images is looked up. In each database, shot data of a shot most matching the actual shot data of a shot is found, and thus the pre-computed consistence between this reconstructed second multiplexed sensitivity encoded image and such matched shot data of a shot is obtained. And, in each database, a magnitude of the first multiplexed sensitivity encoded image most matching the magnitude of the actual first multiplexed sensitivity encoded image is found, and thus the pre-computed consistence between the magnitude of the reconstructed second multiplexed sensitivity encoded image and such matched magnitude of the first multiplexed sensitivity encoded image is found. If, for a database, the obtained pre-computed consistence between this reconstructed second multiplexed sensitivity encoded image and such matched shot data of a shot is below a first threshold, and the obtained pre-computed consistence between the magnitude of the reconstructed second multiplexed sensitivity encoded image and such matched magnitude of the first multiplexed sensitivity encoded image is below a second threshold, the reconstructed second multiplexed sensitivity encoded image specific to this database is a desired image whose phase is the phase to be estimated in step S3.

In an embodiment, the data fidelity term is proportional to a norm of a constant matrix multiplying the desired image whose phase is to be estimated by this step minus shot data of each shot, and the regularization term is proportional to a norm of an absolute value of the desired image whose phase is to be estimated by this step minus the magnitude of the first multiplexed sensitivity encoded image. The regularization equation is for example:

$$\vec{x} = \arg\min\{\|A\vec{x} - \vec{y}\|_2 + \lambda^2\||\vec{x}| - \vec{x}_0\|_2\} \quad \text{equation 1}$$

where $\vec{x}$ is the desired image whose phase is the phase to be estimated in this step; $\vec{y}$ is the shot data of the corresponding shot which appears in the form of an image, as known in the art; A is an encoding matrix which is a constant matrix in a specific MUSE method; $|\vec{x}|$ is an absolute value image of the desired image $\vec{x}$, wherein each pixel in the absolute value image is an absolute value of the corresponding pixel in the desired image $\vec{x}$; $\vec{x}_0$ is the magnitude of the first multiplexed sensitivity encoded image, which is a matrix in which each element has an non-negative value corresponding to the magnitude of the corresponding pixel in the first multiplexed sensitivity encoded image; $\lambda$ is the regularization parameter which is constant in a specific MUSE method; $\|*\|_2$ represents L2 norm of $*$; $\vec{x} = \arg\min\{\ \}$ represents $\vec{x}$ which enables the value of the object function in the { } to be minimum. The first term in { } of argmin{ } is a data fidelity term representing consistence between the reconstructed second multiplexed sensitivity encoded image and shot data of each shot obtained for the site. The second term in { } of argmin{ } is a regularization term representing consistence between a magnitude of the reconstructed second multiplexed sensitivity encoded image and the magnitude of the first multiplexed sensitivity encoded image. The regularization term provides strong constraint which dramatically improves the stability of the equation. The minimization problem can be solved using a conjugate gradient scheme, or any other energy minimization method. Therefore, the desired image $\vec{x}$ can be well determined from equation 1. The phase of the desired image $\vec{x}$ is the second estimated phase.

As shown in FIG. 3, regularized SENSE operations 281, . . . , 28N respectively generate the second estimated phases 291, . . . , 29N based on shot data 211, . . . , 21N and the magnitude 25 of the first MUSE image.

Although in equation 1, the norm is L2 norm. Such a norm can be any other norm such as L3 norm, L4 norm, etc. When the norm is L3 or LA norm, equation 1 correspondingly becomes:

$$\vec{x}=\mathrm{argmin}\{\|A\vec{x}-\vec{y}\|_3+\lambda^3\||\vec{x}|-\vec{x}_0\|_3\} \quad \text{equation 2}$$

$$\vec{x}=\mathrm{argmin}\{\|A\vec{x}-\vec{y}\|_4+\lambda^4\||\vec{x}|-\vec{x}_0\|_4\} \quad \text{equation 3}$$

wherein $\|*\|_3$ represents L3 norm of $*$; $\|*\|_4$ represents L4 norm of $*$.

Figure 4:
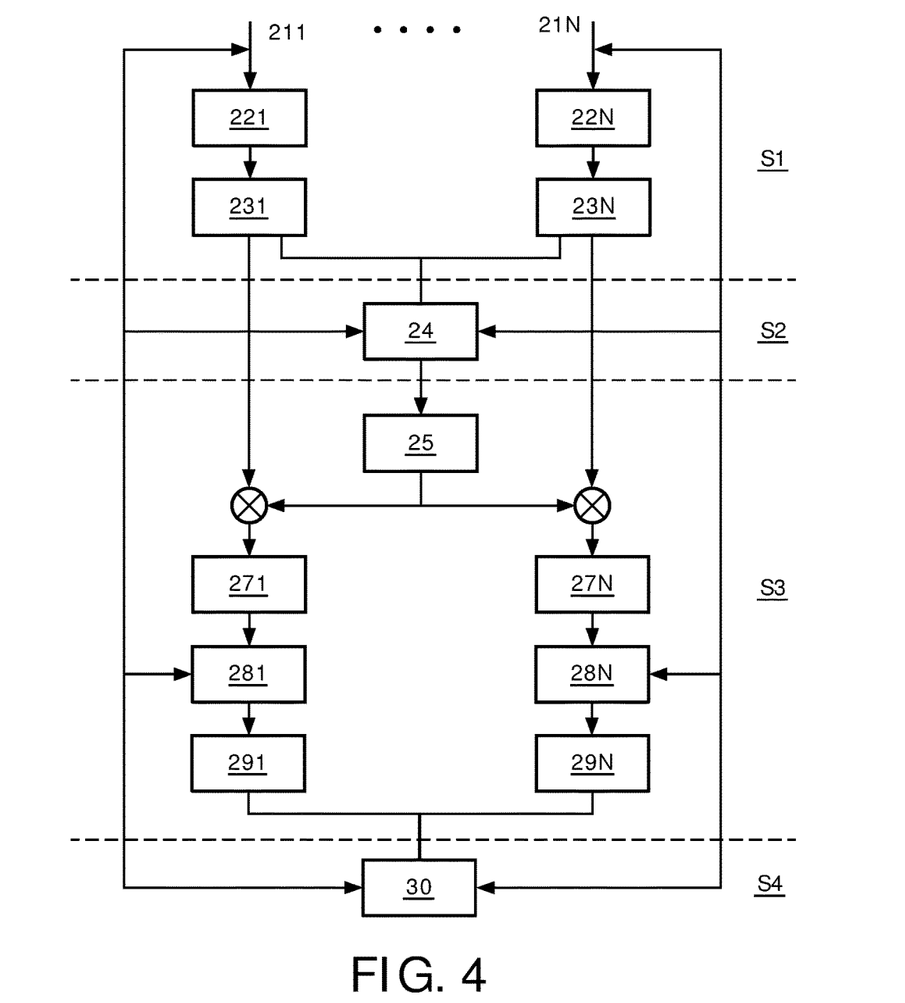
FIG. 4 depicts a schematic graph of the detailed implementation of the method according to another embodiment of this invention.

In another embodiment, the data fidelity term is proportional to a norm of a constant matrix multiplying the desired image whose phase is to be estimated by this step minus shot data of each shot, and the regularization term is proportional to a norm of the desired image whose phase is to be estimated by this step minus a product of the magnitude of the first multiplexed sensitivity encoded image and the first estimated phase of each shot. As illustrated in FIG. 4, which differs from FIG. 3 only in step S3, the regularization equation is:

$$\vec{x}=\mathrm{argmin}\{\|A\vec{x}-\vec{y}\|_2+\lambda^2\|\vec{x}-\vec{x}_1\|_2\} \quad \text{equation 4}$$

where $\vec{x}$ is the desired image whose phase is the phase to be estimated in this step; $\vec{y}$ is the shot data of the corresponding shot which appears in the form of an image, as known in the art; A is an encoding matrix which is a constant matrix in a specific MUSE method; $\vec{x}_1$ is a product of the magnitude of the first multiplexed sensitivity encoded image, which is also an image in which each pixel has a magnitude corresponding to that of the corresponding pixel in the first multiplexed sensitivity encoded image, and the first estimated phase of the corresponding shot, which is an image as well, as known in the art; λ is the regularization parameter which is constant in a specific MUSE method; $\|*\|_2$ represents L2 norm of $*$; $\vec{x}=\mathrm{argmin}\{\}$ represents $\vec{x}$ which enables the value of the object function in the { } to be minimum. The first term in { } of argmin{ } is a data fidelity term representing consistence between the reconstructed second multiplexed sensitivity encoded image and shot data of each shot obtained for the site. The second term in { } of argmin{ } is a regularization term representing consistence between a magnitude of the reconstructed second multiplexed sensitivity encoded image and the magnitude of the first multiplexed sensitivity encoded image. The regularization term provides strong constraint which dramatically improves the stability of the equation. Therefore, the desired image $\vec{x}$ can be determined from equation 4. The phase of the desired image $\vec{x}$ is the second estimated phase.

As shown in FIG. 4, regularized SENSE operations 281, . . . , 28N respectively generate the second estimated phases 291, . . . , 29N based on shot data 211, . . . , 21N and a product 271, . . . , 27N of the magnitude 25 of the first multiplexed sensitivity encoded image 24 and the first estimated phase 231, . . . , 23N.

Although, in equation 4, the norm is L2 norm, such a norm can be any other norm such as L3 norm, LA norm, etc. When the norm is L3 or LA norm, equation 4 correspondingly becomes:

$$\vec{x}=\mathrm{argmin}\{\|A\vec{x}-\vec{y}\|_3+\lambda^3\|\vec{x}-\vec{x}_1\|_3\} \quad \text{equation 5}$$

$$\vec{x}=\mathrm{argmin}\{\|A\vec{x}-\vec{y}\|_4+\lambda^4\|\vec{x}-\vec{x}_1\|_4\} \quad \text{equation 6}$$

wherein $\|*\|_3$ represents L3 norm of $*$; $\|*\|_4$ represents LA norm of $*$.

In still another embodiment, the data fidelity term is proportional to a norm of a constant matrix multiplying the desired image whose phase is to be estimated by this step minus shot data of each shot, and the regularization term is proportional to a norm of a gradient of an absolute value of the desired image whose phase is to be estimated by this step minus a product of the magnitude of the first multiplexed sensitivity encoded image and the first estimated phase of each shot. The corresponding equation is, for example, as follows:

$$\vec{x}=\mathrm{argmin}\{\|A\vec{x}-\vec{y}\|_2+\lambda^2\|\nabla|\vec{x}-\vec{x}_1|\|_2\} \quad \text{equation 7}$$

where $\vec{x}$ is the desired image whose phase is the phase to be estimated in this step; $\vec{y}$ is the shot data of the corresponding shot which appears in the form of an image, as known in the art; A is an encoding matrix which is a constant matrix in a specific MUSE method; $\vec{x}_1$ is a product of the magnitude of the first multiplexed sensitivity encoded image, which is also an image in which each pixel has a magnitude corresponding to that of the corresponding pixel in the first multiplexed sensitivity encoded image, and the first estimated phase of the corresponding shot, which is an image as well, as known in the art; λ is the regularization parameter which is constant in a specific MUSE method; $\|*\|_2$ represents L2 norm of $*$; $|*|$ represents an absolute value of $*$; $\nabla(*)$ represents a gradient of $*$; $\vec{x}=\mathrm{argmin}\{\}$ represents $\vec{x}$ which enables the value of the object function in the { } to be minimum. The first term in { } of argmin{ } is a data fidelity term representing consistence between the reconstructed second multiplexed sensitivity encoded image and shot data of each shot obtained for the site. The second term in { } of argmin{ } is a regularization term representing consistence between a magnitude of the reconstructed second multiplexed sensitivity encoded image and the magnitude of the first multiplexed sensitivity encoded image in low frequency. That is, the regularization term only causes the magnitude of the reconstructed second multiplexed sensitivity encoded image to have a high frequency difference with the magnitude of the first multiplexed sensitivity encoded image. The regularization is less strong than constraints in equation 1 or 4. However, it can also result in higher quality of a reconstructed image. Therefore, the desired image $\vec{x}$ can be determined from equation 7. The phase of the desired image $\vec{x}$ is the second estimated phase.

Although, in equation 7, the norm is L2 norm, such a norm can be any other norm such as L3 norm, L4 norm, etc. When the norm is L3 or L4 norm, equation 4 correspondingly becomes:

$$\vec{x}=\mathrm{argmin}\{\|A\vec{x}-\vec{y}\|_3+\lambda^3\|\nabla|\vec{x}-\vec{x}_1|\|_3\} \quad \text{equation 8}$$

$$\vec{x}=\mathrm{argmin}\{\|A\vec{x}-\vec{y}\|_4+\lambda^4\|\nabla|\vec{x}-\vec{x}_1|\|_4\} \quad \text{equation 9}$$

wherein $\|*\|_3$ represents L3 norm of $*$; $\|*\|_4$ represents L4 norm of $*$.

In the above equations 4-9, the first estimated phase of each shot can be smoothed before multiplying the magnitude of the first multiplexed sensitivity encoded image to obtain the product. Said smoothing further improves the quality of the finally reconstructed image in the MUSE method.

It is noted by those skilled in the art that the above equations 1-9 are only illustrative, and other equations may be also constructed by those skilled in the art for regularized sensitivity encoding based on shot data of the corresponding shot.

The method further comprises step S4 of reconstructing a second multiplexed sensitivity encoded image based on the second estimated phase of each shot and shot data of each shot.

As illustrated above, a MUSE method is used to reconstruct an image based on shot data of each shot and phase estimation results of the SENSE operations it includes.

Again taking the example of FIG. 3, a second MUSE image 30 is reconstructed based on the second estimated phases 291, ..., 29N and the shot data 211, ..., 21N.

FIG. 5 depicts a block chart of a device 4 according to an embodiment of this invention.

According to an embodiment of another aspect of this invention, an image processing apparatus 14 for constructing an image of a site of a subject is provided. The image processing apparatus 14 comprises: a first generating unit 401 configured to generate a first estimated phase of each shot of multiple shots by sensitivity encoding based on shot data of the corresponding shot obtained for the site; a first reconstructing unit 402 configured to reconstruct a first multiplexed sensitivity encoded image based on the first estimated phase of each shot and shot data of each shot; a second generating unit 403 configured to generate a second estimated phase of each shot of the multiple shots by regularized sensitivity encoding using the first multiplexed sensitivity encoded image; a second reconstructing unit 404 configured to reconstruct a second multiplexed sensitivity encoded image based on the second estimated phase of each shot and shot data of each shot.

Further, the second generating unit 403 may be further configured to generate the second estimated phase of each shot of the multiple shots by regularized sensitivity encoding based on shot data of the corresponding shot, and at least a magnitude of the first multiplexed sensitivity encoded image.

Furthermore, the regularized sensitivity encoding based on shot data of the corresponding shot and at least a magnitude of the first multiplexed sensitivity encoded image may be performed by solving a regularization equation to be minimum, the regularization equation being equal to a data fidelity term plus a regularization term, the data fidelity term representing consistence between the reconstructed second multiplexed sensitivity encoded image and shot data of each shot obtained for the site, and the regularization term representing consistence between a magnitude of the reconstructed second multiplexed sensitivity encoded image and the magnitude of the first multiplexed sensitivity encoded image.

Further, in an embodiment, the regularization term may be proportional to a norm of an absolute value of the desired image whose phase is to be estimated by the second generating unit 403 minus the magnitude of the first multiplexed sensitivity encoded image.

Furthermore, in another embodiment, the regularization term may be proportional to a norm of the desired image whose phase is to be estimated by the second generating unit 403 minus a product of the magnitude of the first multiplexed sensitivity encoded image and the first estimated phase of each shot.

Further, in yet another embodiment, the regularization term may be proportional to a norm of a gradient of an absolute value of the desired image whose phase is to be estimated by the second generating unit 403 minus a product of the magnitude of the first multiplexed sensitivity encoded image and the first estimated phase of each shot.

Furthermore, the first estimated phase of each shot may be smoothed before multiplying the magnitude of the first multiplexed sensitivity encoded image to obtain the product.

Further, the data fidelity term may be proportional to a norm of a constant matrix multiplying the desired image whose phase is to be estimated by the second generating unit 403 minus shot data of each shot.

Furthermore, the shot data of the corresponding shot obtained for the site is obtained by subsampling a phase encoded magnetic resonance signal, the phase encoded magnetic resonance signal being generated by consecutively applying, upon RF pulse excitation, forward and reverse switched magnetic field gradient pulses to the site.

According to an embodiment of still another aspect of this invention, a magnetic resonance imaging device 1 is provided. The magnetic resonance imaging device 1 comprises: a radiation emitter 6 configured to apply RF pulses to a site of a subject; a gradient coil 3, 4, 5 configured to apply magnetic field gradient pulses to the site so that the applied RF pulses and the applied magnetic field gradient pulses together generate a phase encoded magnetic resonance signal at the site; a plurality of obtaining units 201, ..., 20N configured to respectively subsample the phase encoded magnetic resonance signal at the site to obtain shot data of multiple shots; an image processing apparatus 14 configured to generate a first estimated phase of each shot of the multiple shots by sensitivity encoding based on shot data of the corresponding shot, reconstruct a first multiplexed sensitivity encoded image based on the first estimated phase of each shot and shot data of each shot, generate a second estimated phase of each shot of the multiple shots by regularized sensitivity encoding using the first multiplexed sensitivity encoded image, and reconstruct a second multiplexed sensitivity encoded image based on the second estimated phase of each shot and shot data of each shot.

Figure 6:
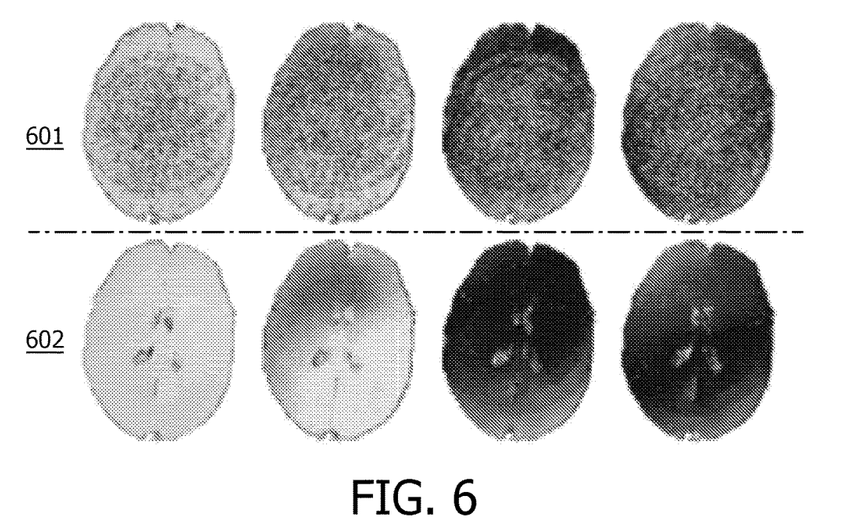
FIG. 6 depicts an experiment comparison of a first estimated phase and a second estimated phase according to an embodiment of this invention, wherein the second estimated phase is obtained by regularized sensitivity encoding using the first multiplexed sensitivity encoded image.

FIG. 6 depicts an experiment comparison of a first estimated phase and a second estimated phase according to an embodiment of this invention, wherein the second estimated phase is obtained by regularized sensitivity encoding using the first multiplexed sensitivity encoded image.

To demonstrate advantages of this invention, 6 shots and a number of signal averages (NSA) of 3 are adopted in the diffusion weighted EPI method according to an embodiment of this invention on a Philips 3T Achieva scanner with an 8-channel head coil. 15 slices were acquired using a field of view (FOV) of 220×220 mm$^2$, a voxel size of 0.89×0.89×4 mm$^3$, 6 diffusion directions with b=800 s/mm$^2$. Reference sign 601 represents the obtained first estimated phase, while reference sign 602 represents the obtained second estimated phase. As can be seen from FIG. 6, because the second estimated phase is obtained by regularized sensitivity encoding using the first multiplexed sensitivity encoded image, it can significantly improve spatial resolution as compared to the obtained first estimated phase.

Figure 7:
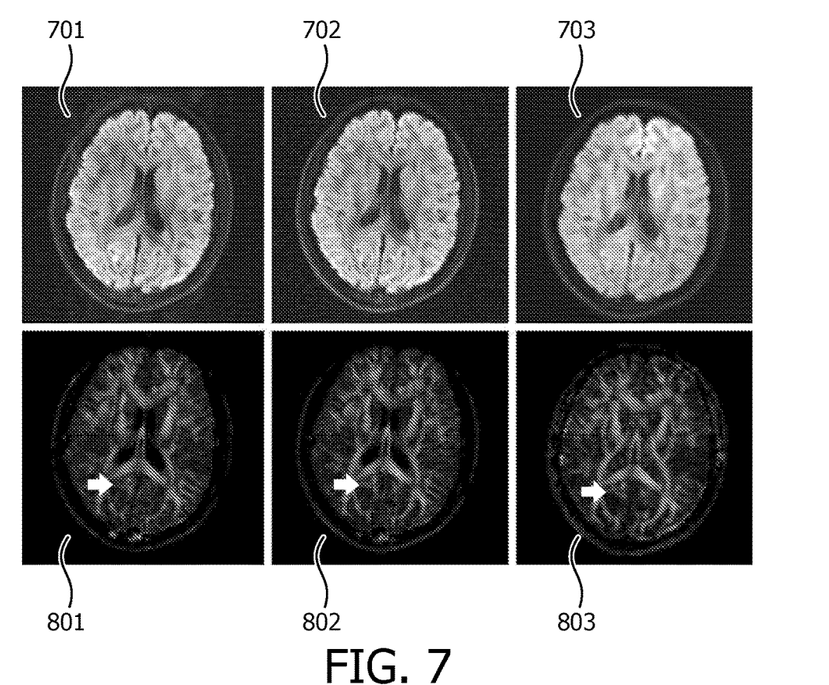
FIG. 7 depicts an experiment comparison of an image reconstructed by using a conventional MUSE method in the prior art, an image reconstructed according to an embodiment of this invention and an image reconstructed by using the conventional single-shot EPI method in the prior art, and an experiment comparison of a FA derived from the image reconstructed by using a conventional MUSE method in the prior art, a FA derived from an image reconstructed according to an embodiment of this invention and a FA derived from an image reconstructed by using the conventional single-shot EPI method in the prior art.

FIG. 7 depicts an experiment comparison of an image 701 reconstructed by using a conventional MUSE method in the prior art, an image 702 reconstructed according to an embodiment of this invention and an image 703 reconstructed by using the conventional single-shot EPI method in the prior art, and an experiment comparison of a fractional anisotropy (FA) 801 derived from the image reconstructed by using a conventional MUSE method in the prior art, a FA 802 derived from an image reconstructed according to an embodiment of this invention and a FA 803 derived from an image reconstructed by using the conventional single-shot EPI method in the prior art. The experiment condition is the same as that for FIG. 6.

Clinically, doctors often use an FA map for diagnosis. The FA or FA map is calculated or derived from the reconstructed image in magnetic resonance imaging by a known algorithm. FA is the square root of the sum of squares (SRSS) of the diffusivity differences of the reconstructed image divided by the SRSS of the diffusivities of the reconstructed image.

As can be seen from FIG. 7, as compared to the image 701 reconstructed by using a conventional MUSE method in the prior art, the image 702 reconstructed according to an embodiment of this invention has a lower artefact level and a higher spatial resolution. As compared to the image 703 reconstructed by using the conventional single-shot EPI method in the prior art, the image 702 reconstructed according to an embodiment of this invention provides more structure details. And, as compared to the fractional anisotropy (FA) 801 derived from the image reconstructed by using a conventional MUSE method in the prior art and the FA 803 derived from an image reconstructed by using the conventional single-shot EPI method in the prior art, the FA 802 derived from an image reconstructed according to an embodiment of this invention provides more tensor information as indicated by means of arrows.

It should be noted that the above-mentioned embodiments illustrate rather than limit the invention and that those skilled in the art would be able to design alternative embodiments without departing from the scope of the appended claims. The embodiments are illustrative rather than restrictive. It is intended that the invention include all modifications and variations to the illustrated and described embodiments within the scope and spirit of the invention. In the claims, any reference signs placed between parentheses shall not be construed as limiting the claim. The word "comprising" does not exclude the presence of elements or steps not listed in a claim or in the description. The word "a" or "an" preceding an element does not exclude the presence of a plurality of such elements. In the device claims enumerating several units, several of these units can be embodied by one and the same item of hardware or software. The usage of the words first, second and third, et cetera, does not indicate any ordering. These words are to be interpreted as names.

The invention claimed is:

1. An image processing method for reconstructing an image of a site of a subject, comprising:
   generating a first estimated phase of each shot of multiple shots by sensitivity encoding based on shot data of the corresponding shot obtained for the site;
   reconstructing a first multiplexed sensitivity encoded image based on the first estimated phase of each shot and shot data of each shot;
   generating a second estimated phase of each shot of the multiple shots by regularized sensitivity encoding using the first multiplexed sensitivity encoded image; and
   reconstructing a second multiplexed sensitivity encoded image based on the second estimated phase of each shot and shot data of each shot;
   wherein the regularized sensitivity encoding is performed using a regularization term representing consistence between a magnitude of the reconstructed second multiplexed sensitivity encoded image and a magnitude of the first multiplexed sensitivity encoded image.

2. The image processing method according to claim 1, wherein the step of generating a second estimated phase of each shot of the multiple shots comprises generating the second estimated phase of each shot of the multiple shots by regularized sensitivity encoding based on shot data of the corresponding shot, and at least a magnitude of the first multiplexed sensitivity encoded image.

3. The image processing method according to claim 2, wherein the regularized sensitivity encoding based on shot data of the corresponding shot and at least a magnitude of the first multiplexed sensitivity encoded image is performed by solving a regularization equation to be minimum, the regularization equation being equal to a data fidelity term plus a regularization term, the data fidelity term representing consistence between the reconstructed second multiplexed sensitivity encoded image and shot data of each shot obtained for the site, and the regularization term representing consistence between the magnitude of the reconstructed second multiplexed sensitivity encoded image and the magnitude of the first multiplexed sensitivity encoded image.

4. The image processing method according to claim 1, wherein the shot data of the corresponding shot obtained for the site is obtained by subsampling a phase encoded magnetic resonance signal, the phase encoded magnetic resonance signal being generated by applying RF pulses and magnetic field gradient pulses or diffusion gradients to the site.

5. The image processing method according to claim 1, wherein the shot data of the corresponding shot obtained for the site is obtained by subsampling a phase encoded magnetic resonance signal, the phase encoded magnetic resonance signal being generated by consecutively applying, upon RF pulse excitation, forward and reverse switched magnetic field gradient pulses to the site.

6. An image processing apparatus for constructing an image of a site of a subject, comprising:
   a first generating unit configured to generate a first estimated phase of each shot of multiple shots by sensitivity encoding based on shot data of the corresponding shot obtained for the site;
   a first reconstructing unit configured to reconstruct a first multiplexed sensitivity encoded image based on the first estimated phase of each shot and shot data of each shot;
   a second generating unit configured to generate a second estimated phase of each shot of the multiple shots by regularized sensitivity encoding using the first multiplexed sensitivity encoded image;
   a second reconstructing unit configured to reconstruct a second multiplexed sensitivity encoded image based on the second estimated phase of each shot and shot data of each shot.

7. The image processing apparatus according to claim 6, wherein the second generating unit is further configured to generate the second estimated phase of each shot of the multiple shots by regularized sensitivity encoding based on shot data of the corresponding shot, and at least a magnitude of the first multiplexed sensitivity encoded image.

8. The image processing apparatus according to claim 7, wherein the regularized sensitivity encoding based on shot data of the corresponding shot and at least a magnitude of the first multiplexed sensitivity encoded image is performed by solving a regularization equation to be minimum, the regularization equation being equal to a data fidelity term plus a regularization term, the data fidelity term representing consistence between the reconstructed second multiplexed sensitivity encoded image and shot data of each shot obtained for the site, and the regularization term representing consistence between a magnitude of the reconstructed second multiplexed sensitivity encoded image and the magnitude of the first multiplexed sensitivity encoded image.

9. The image processing apparatus according to claim 8, wherein the regularization term is proportional to a norm of an absolute value of the desired image whose phase is to be estimated by the second generating unit minus the magnitude of the first multiplexed sensitivity encoded image.

10. The image processing apparatus according to claim 8, wherein the regularization term is proportional to a norm of the desired image whose phase is to be estimated by the second generating unit minus a product of the magnitude of the first multiplexed sensitivity encoded image and the first estimated phase of each shot.

11. The image processing apparatus according to claim 8, wherein the regularization term is proportional to a norm of a gradient of an absolute value of the desired image whose phase is to be estimated by the second generating unit minus a product of the magnitude of the first multiplexed sensitivity encoded image and the first estimated phase of each shot.

12. The image processing apparatus according to claim 10, wherein the first estimated phase of each shot is smoothed before multiplying the magnitude of the first multiplexed sensitivity encoded image to obtain the product.

13. The image processing apparatus according to claim 8, wherein the data fidelity term is proportional to a norm of a constant matrix multiplying the desired image whose phase is to be estimated by the second generating unit minus shot data of each shot.

14. The image processing apparatus according to claim 8, wherein the shot data of the corresponding shot obtained for the site is obtained by subsampling a phase encoded magnetic resonance signal, the phase encoded magnetic resonance signal being generated by consecutively applying, upon RF pulse excitation, forward and reverse switched magnetic field gradient pulses to the site.

15. A magnetic resonance imaging device comprising:
a radiation emitter configured to apply RF pulses to a site of a subject;
a gradient coil configured to apply magnetic field gradient pulses to the site so that the applied RF pulses and the applied magnetic field gradient pulses together generate a phase encoded magnetic resonance signal at the site;
a plurality of obtaining units configured to respectively subsample the phase encoded magnetic resonance signal of the site to obtain shot data of multiple shots;
an image processing apparatus configured to
generate a first estimated phase of each shot of the multiple shots by sensitivity encoding based on shot data of the corresponding shot;
reconstruct a first multiplexed sensitivity encoded image based on the first estimated phase of each shot and shot data of each shot;
generate a second estimated phase of each shot of the multiple shots by regularized sensitivity encoding using the first multiplexed sensitivity encoded image;
reconstruct a second multiplexed sensitivity encoded image based on the second estimated phase of each shot and shot data of each shot.

16. The magnetic resonance imaging device according to claim 15, wherein the image processing apparatus is further configured to generate the second estimated phase of each shot of the multiple shots by regularized sensitivity encoding based on shot data of the corresponding shot, and at least a magnitude of the first multiplexed sensitivity encoded image.

17. The magnetic resonance imaging device according to claim 16, wherein the regularized sensitivity encoding based on shot data of the corresponding shot and at least a magnitude of the first multiplexed sensitivity encoded image is performed by solving a regularization equation to be minimum, the regularization equation being equal to a data fidelity term plus a regularization term, the data fidelity term representing consistence between the reconstructed second multiplexed sensitivity encoded image and shot data of each shot obtained for the site, and the regularization term representing consistence between a magnitude of the reconstructed second multiplexed sensitivity encoded image and the magnitude of the first multiplexed sensitivity encoded image.

18. The magnetic resonance imaging device according to claim 17, wherein the regularization term is proportional to one of:
a norm of an absolute value of the desired image whose phase is to be estimated by the second generating unit minus the magnitude of the first multiplexed sensitivity encoded image;
a norm of the desired image whose phase is to be estimated by the second generating unit minus a product of the magnitude of the first multiplexed sensitivity encoded image and the first estimated phase of each shot; or
a norm of a gradient of an absolute value of the desired image whose phase is to be estimated by the second generating unit minus a product of the magnitude of the first multiplexed sensitivity encoded image and the first estimated phase of each shot.

19. The magnetic resonance imaging device according to claim 18, wherein the first estimated phase of each shot is smoothed before multiplying the magnitude of the first multiplexed sensitivity encoded image to obtain the product.

20. The magnetic resonance imaging device according to claim 18, wherein at least one:
the data fidelity term is proportional to a norm of a constant matrix multiplying the desired image whose phase is to be estimated by the second generating unit minus shot data of each shot; and
the shot data of the corresponding shot obtained for the site is obtained by subsampling a phase encoded magnetic resonance signal, the phase encoded magnetic resonance signal being generated by consecutively applying, upon RF pulse excitation, forward and reverse switched magnetic field gradient pulses to the site.

* * * * *